United States Patent [19]

Prado et al.

[11] 4,208,079
[45] Jun. 17, 1980

[54] HIGH DENSITY INTEGRATED CIRCUIT PACKAGE

[75] Inventors: Philip G. Prado, Manassas; Raymond L. Stuckey, Sterling; Fredrick O. Volles, Manassas, all of Va.

[73] Assignee: International Business Machines Corporation, Armonk, N.Y.

[21] Appl. No.: 5,946

[22] Filed: Jan. 24, 1979

[51] Int. Cl.² ............................................ H05K 7/16
[52] U.S. Cl. .................................. 312/202; 361/391; 361/415
[58] Field of Search ............... 312/252, 202, 305, 306, 312/307, 308; 211/26; 16/162, 163; 361/380, 381, 382, 385, 386, 388, 390–395, 412, 413, 415, 428, 429

[56] References Cited

U.S. PATENT DOCUMENTS

| 241,123 | 5/1881 | Danner | 312/202 |
| 2,928,555 | 3/1960 | Childs | 361/391 |
| 2,950,155 | 8/1960 | Schick | 312/202 |
| 3,631,325 | 12/1971 | Wenz | 361/415 |
| 3,745,399 | 7/1973 | Usizima | 361/391 |

Primary Examiner—Gerald P. Tolin
Attorney, Agent, or Firm—Maurice H. Klitzman

[57] ABSTRACT

A high density integrated circuitry package is disclosed where gates containing the circuit cards are rotatably mounted in the cabinet with some of the gates fixed to a central core and other gates pivoted to the core. The pivoted gates are extendable outside of the cabinet for diagnostic and maintenance purposes and for simultaneously providing access to the fixed gates.

4 Claims, 15 Drawing Figures

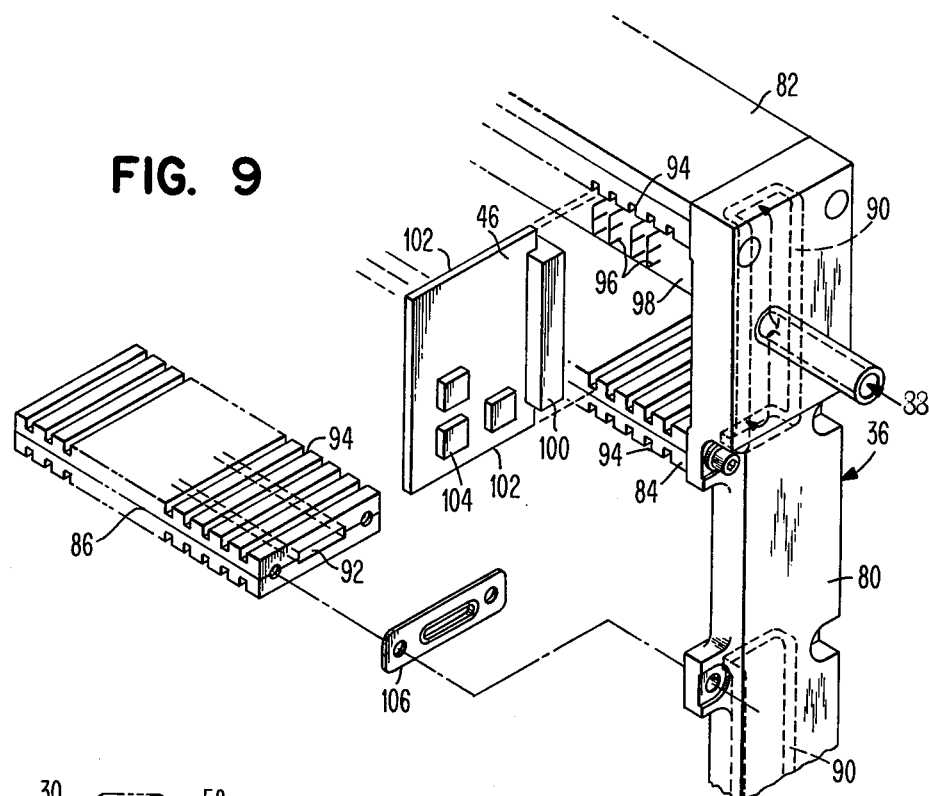
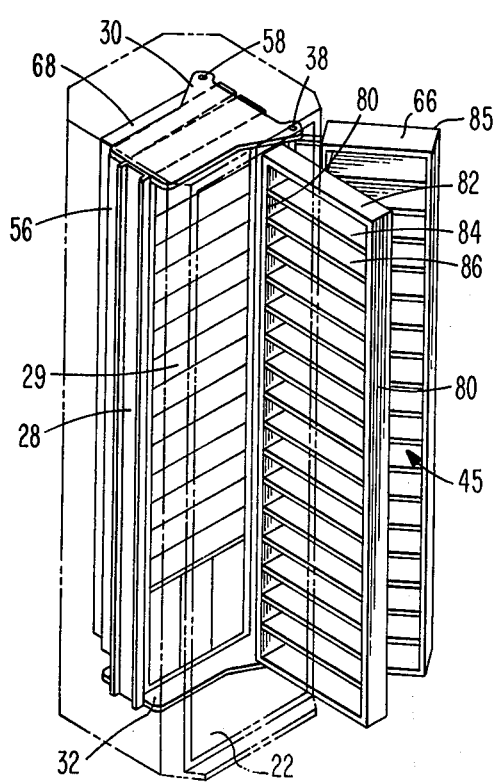
FIG. 9
FIG. 8

HIGH DENSITY INTEGRATED CIRCUIT PACKAGE

BACKGROUND OF THE INVENTION

This invention relates to an improved electronic circuit package and in particular to high density integrated circuitry, which integrated circuitry has a high input or output requirement with diagonostic accessibility within minimal space requirements.

In utilizing relatively large size computers in oceanic-going vessels, aircraft, trailers, vans and restricted office space, where space is a premium, integrated circuit cards with their accompanying power supplies have been packaged to fit into rectangular cabinets containing sliding drawers, such as shown in FIG. 1. Typically, it includes a cabinet 1 with vertical drawer 3. FIGS. 2A and 2B show a frame or gate 2 having a circuit board 4 mounted thereon which oftentimes may be a plurality of circuit boards 4. The circuit board contains a plurality of cards 6 mounted thereon which cards contain integrated circuit modules 8 which are electrically connected through circuit wiring on the card 6, through the connector 10 to the pins 12 on the circuit board 4. A gate is that portion of the drawer that the circuit cards and the power supplies are mounted to. In an effort to increase density, as increased functions are desired for the computer package within the same volume, there is a natural tendency to make the overall assembly of the components more compact so as to retain speed. The increase in density and speed results in a requirement for accessing the pin side of the gates which is lacking in the drawer type cabinets of FIG. 1.

Also, as density and speed is increased, power consumption is increased thereby necessitating the requirement for higher heat dissipation cabability. The heretofore air cooling ductwork schemes have not been satisfactory because of requiring greater space to adequately cool, and therefore, has placed a limitation on increasing density.

Further, because of space limitations circuit cabinets are required to be front accessible so that the drawers containing gates may be pulled for inspection into relatively narrow aisles.

OBJECTS OF THE INVENTION

Accordingly, it is an object of this invention to increase the density of packaged integrated circuit technology in an improved manner.

It is another object of the invention to provide an improved compact circuit package for computer applications which can be adequately accessed for diagnostics and component exchange purposes.

It is still another object of the invention to improve upon a drawer type cabinet while allowing for increased accessibility to the pin side of each gate.

It is yet another object of the invention to provide a more efficient cooling scheme for a high density circuit package.

These and other objects may be obtained through the use of the integrated circuit package described herein. The cabinet itself is octagonally shaped to more closely resemble a circle with a rotatable core centrally mounted therein. Some of the gates are pivotally mounted to the central rotatable core and others fixed to the core. The core has approximately 200° angular rotation to minimize the length of the input/output cabling required while maintaining access to each gate. Furthermore, one side of the opening of the cabinet through which the gates are extractable is offset from the other side. This is to accommodate full extendability of the gates outside of the cabinet so that the pins and cards of the fixed center gate or gates can be readily accessible for diagnostic purposes.

By making some of the card gates pivotally mounted on a rotatable central core and others fixed to the core, density was increased from approximately 1800 cards to 3500 cards for substantially the same space previously occupied by prior art devices.

While the integrated circuit package was intended for areas that had space limitations, it can be applied to any packaging scheme. For example, the particular arrangement can be utilized in any computer installation.

The foregoing and other objects, features and advantages of the invention will become apparent from the following more particular description of the preferred embodiment of the invention, as illustrated in the accompanying drawings.

DESCRIPTION OF THE FIGURES

These and other objects, features and advantages of the invention will be more fully appreciated with reference to the accompanying figures.

FIG. 8 is an iosmetric view of a gate pair deployed through the cabinet opening and separated from one another for pin side access to either gate.

FIG. 9 is an isometric view of the detailed construction of the gates.

DISCUSSION OF THE PREFERRED EMBODIMENT

Figure 1:
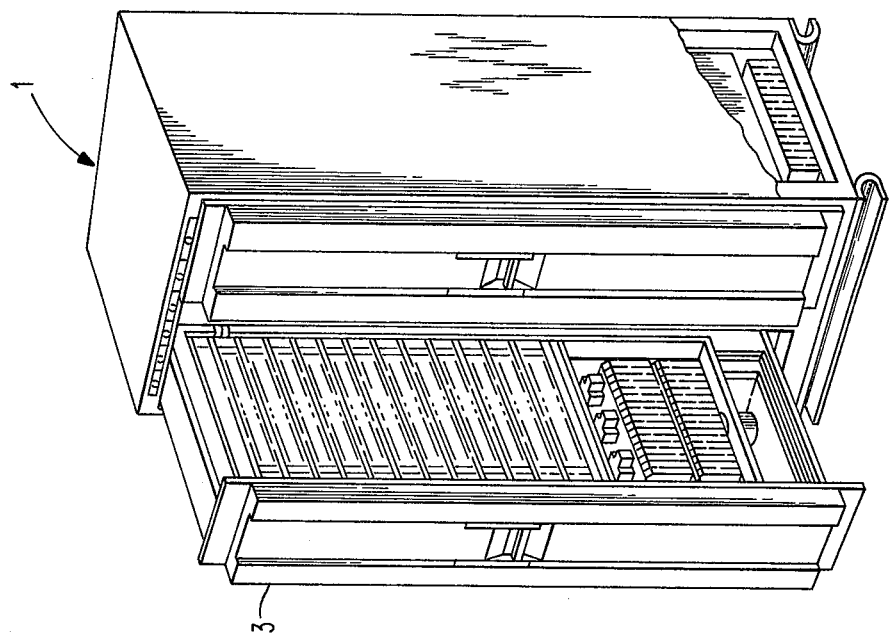
FIG. 1 is an isometric view of a prior art cabinet.
Figure 2A:
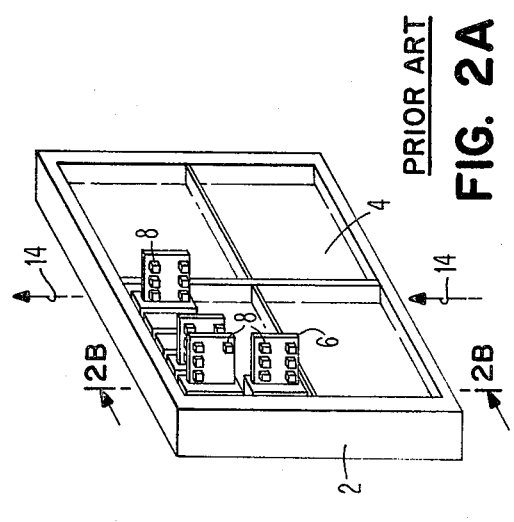
FIG. 2A is an isometric view of a prior art electronic gate.
Figure 2B:
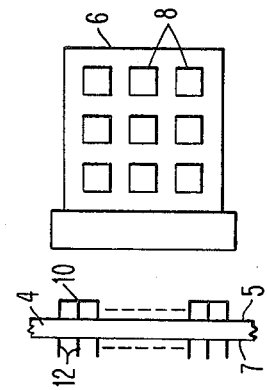
FIG. 2B is a cross-sectional view along the section line 2B—2B of the prior art gate in FIG. 2A showing a circuit card.
Figures 3A, 3B:
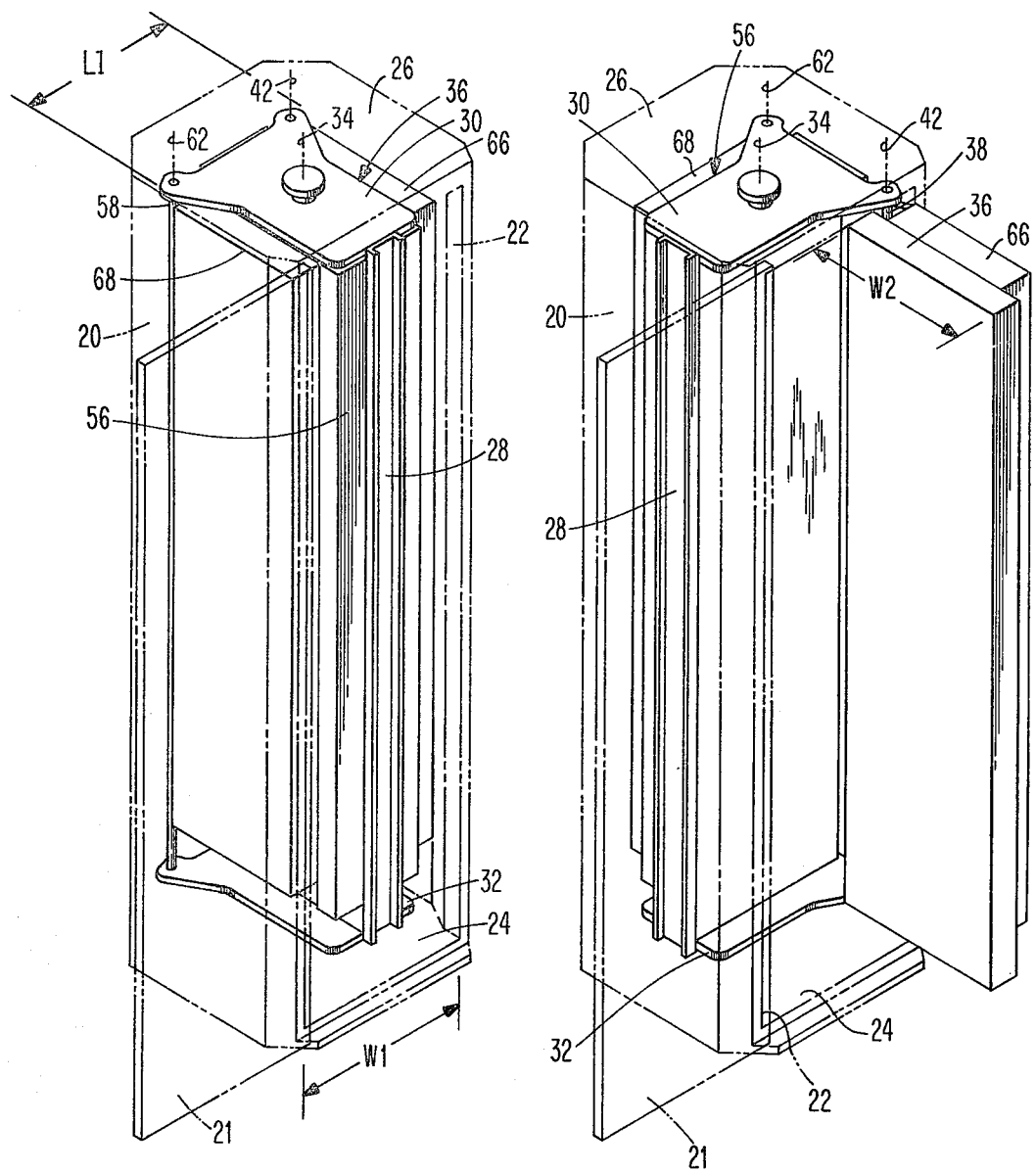
FIG. 3A is an isometric view of the rotatable core assembly with the gates retracted into the cabinet.
FIG. 3B is another isometric view of the rotatable core assembly showing the gates deployed through the cabinet opening to a position outside of the cabinet.

FIGS. 3A and 3B show isometric views of the rotary core assembly with the cabinet shown in phantom with the door 21 shown in open position. The cabinet 20 has an opening 22 with a first horizontal width W1 on the front surface thereof, a bottom horizontal platform 24 and a top horizontal platform 26. The central core 28 is rotatably mounted by means of the upper plate 30 and the lower plate 32 to the upper platform 26 and lower platform 24 of the cabinet housing 20. This enables the rotational motion of the central core 28 about a first vertical axis 34.

Figure 4:
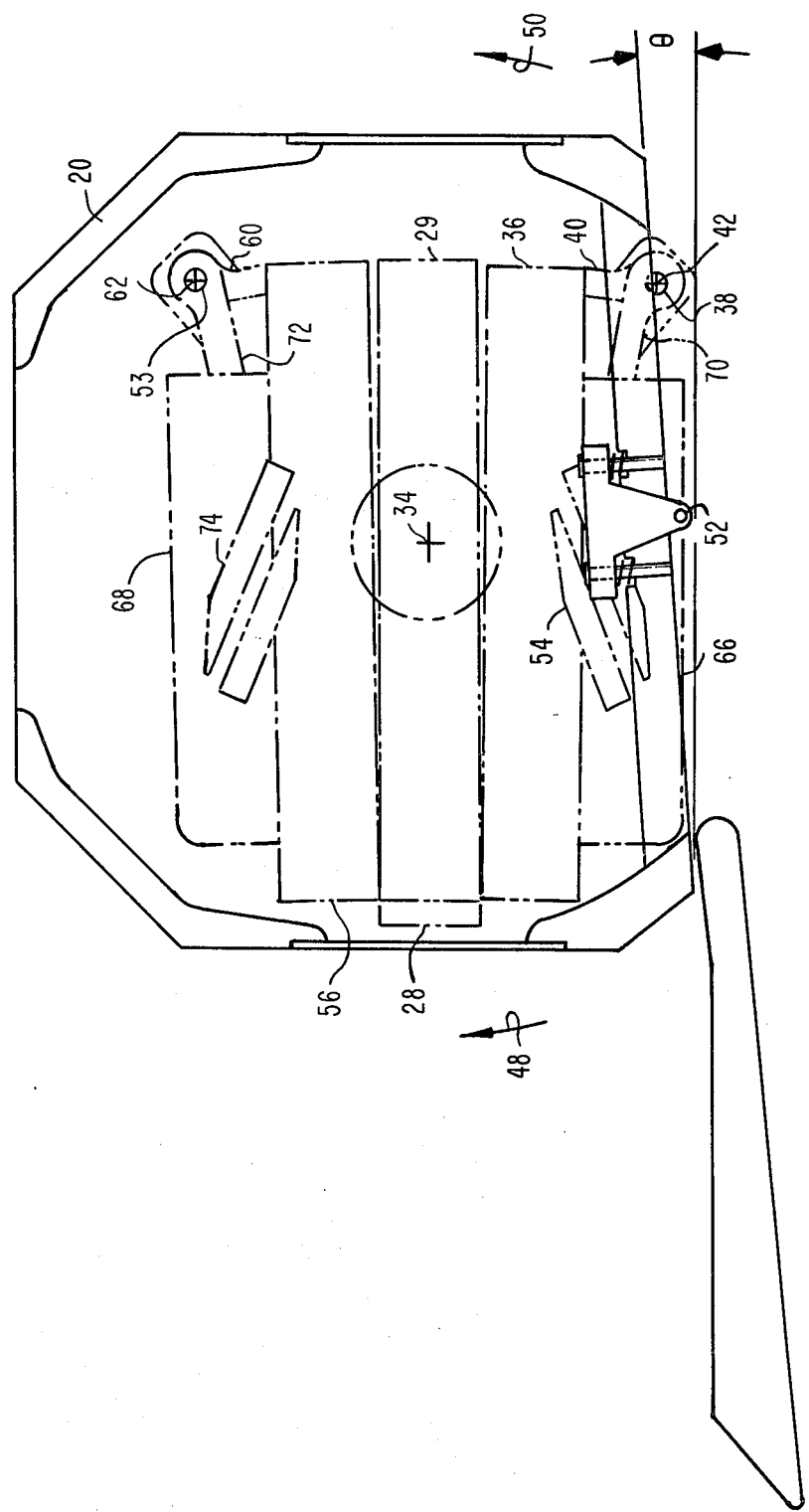
FIG. 4 is a plan view showing the home position of the rotatable core assembly prior to its rotation for extraction of the gate pairs.
Figure 5:
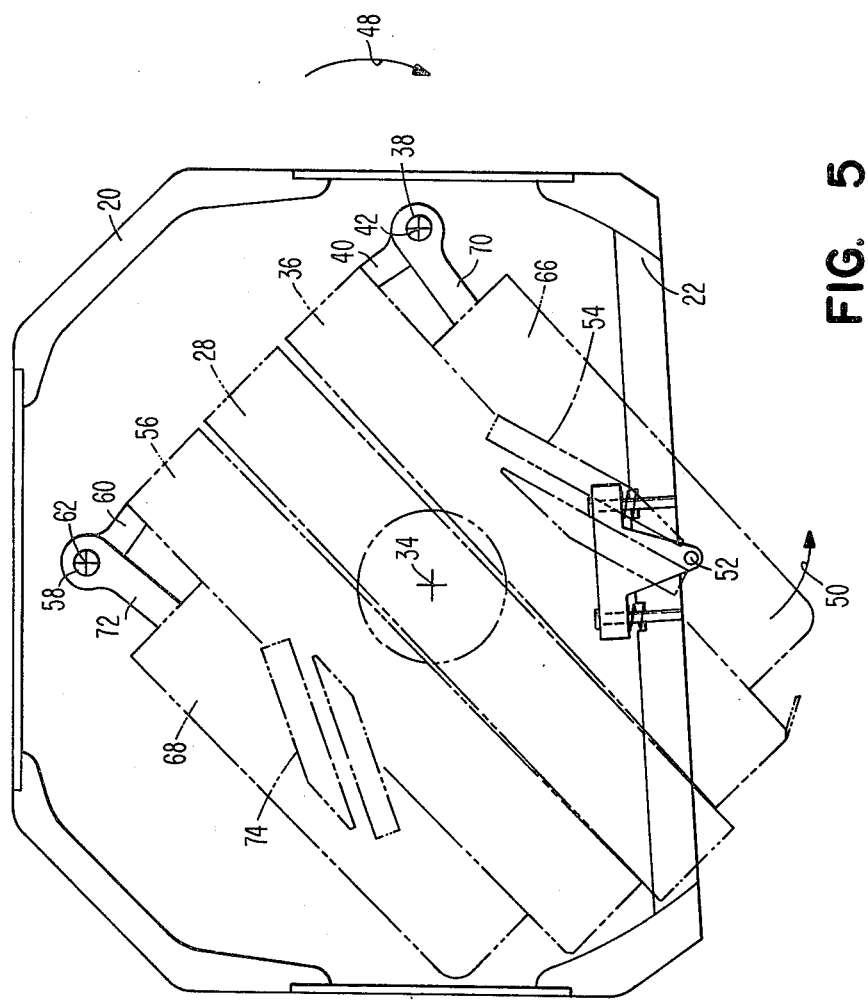
FIG. 5 is a plan view of the rotatable core assembly in its right gate pair extraction position.

A gate 36 has a second horizontal width W2 which is greater than the first horizontal width W1 of the opening 22 in the cabinet 20. Referring to FIGS. 4 and 5, the gate 36 is hingedly mounted by means of the hasp 40 onto the vertical hinge shaft 38 which, in turn, is anchored to the lower plate 32 and upper plate 30 of the core 28. The vertical hinge shaft 38 forms a second vertical axis 42 which is displaced from the first vertical axis 34.

Reference is made to FIG. 4, which shows the rotatable core assembly in home position. In order to initiate extraction of the first gate pair 36, 66, the core assembly 28 is rotated approximately 45° about axis 34 in a first direction 50, as shown in FIG. 5.

Figure 5A:
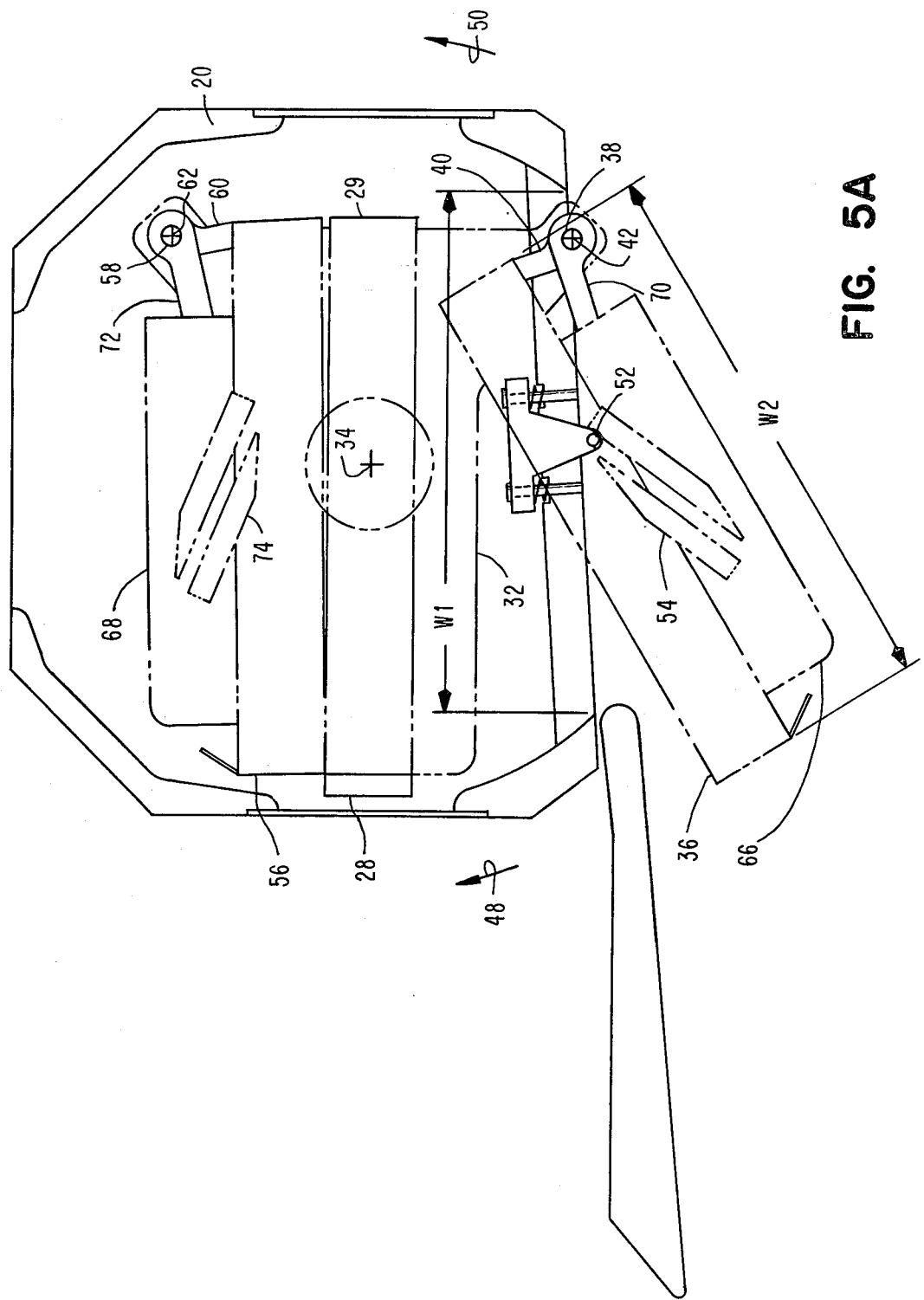
FIG. 5A is a plan view of the rotatable core assembly with the right gate pair having been pulled through the cabinet opening.

The first gate pair 36, 66 may be deployed through the housing opening 22, from the position shown in FIG. 5 to the position shown in FIG. 5A. The core 28 being in its right gate pair extraction position in FIG. 5 places the right gate pair extraction track 54, which is mounted on the top of the gate 36, in a position to engage the guide pin 52 mounted on the upper platform 26 of the cabinet housing 20. When the gate pair is pulled, the core 28 is rotated about the first vertical axis 34 in a second direction 48, the gate pair however, because of the guide pin 52 in extraction track 54, causes the gate pair to rotate about the second axis 42 in the first direction 50, thereby extending the gate pair 36, 66 through the housing opening 22. In order to achieve final position of deployment for the gate pair 36, 66 from the position shown in FIG. 5A to the position shown in FIG. 5B the gate pair 36, 66 is pivoted about axis 42 in direction 50.

The first gate pair 36, 66 serves as the framework for mounting the electronics circuit cards 46, shown to better advantage in FIGS. 8 and 9.

Figure 6:
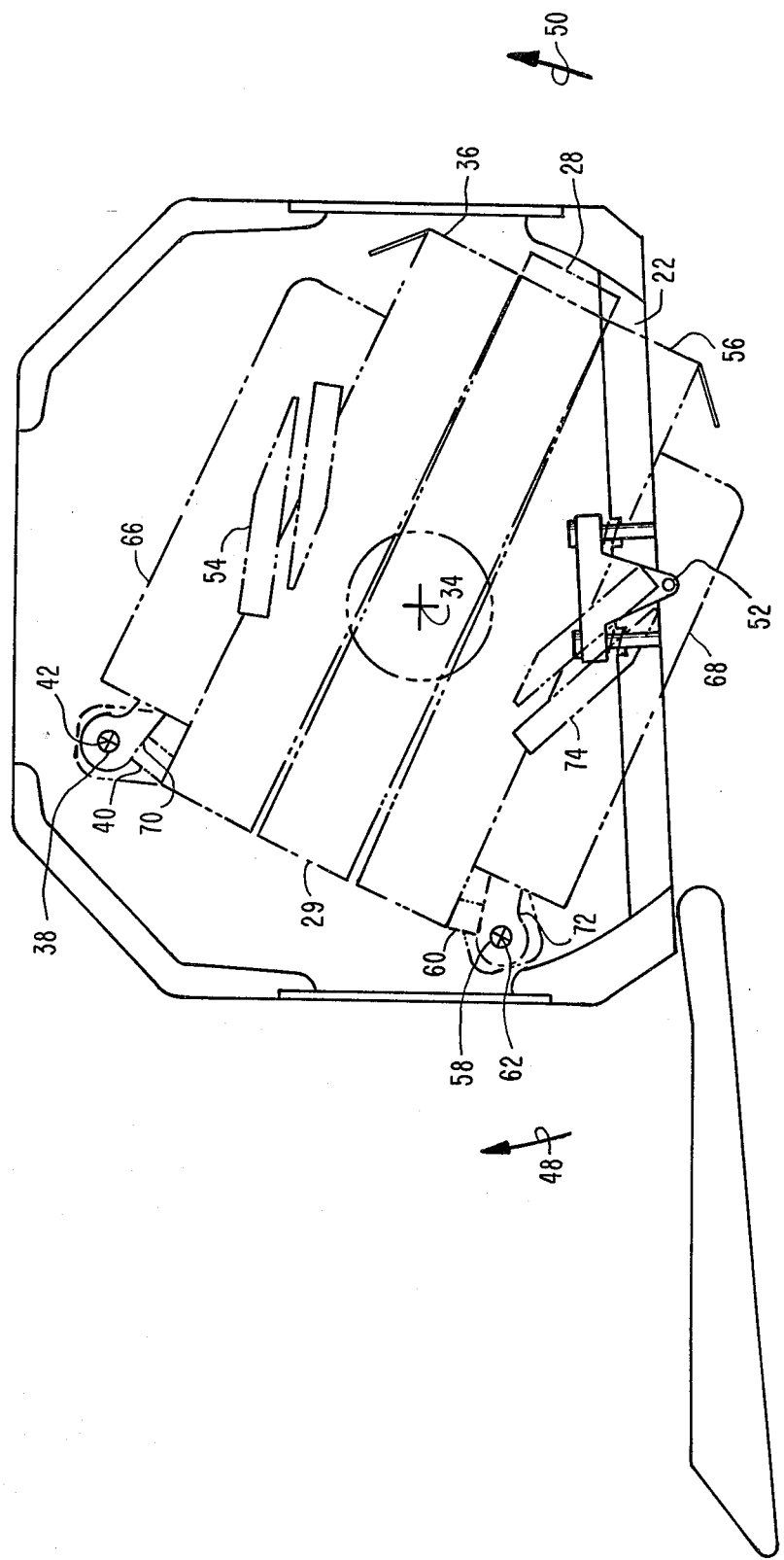
FIG. 6 is a plan view of the rotatable core assembly in the left gate extraction position.

Referring to FIG. 6, the rotatable core assembly includes a second gate pair 56, 68 which is similar to the first gate pair 36, 66. The second gate pair 56, 68 also has a second horizontal width W2 which is greater than the first width W1 of the opening 22 in the cabinet housing 20. The second gate pair 56, 68 is hingedly mounted by means of the hasp 60 to the vertical hinge shaft 58 which, in turn, is mounted to the lower plate 32 and upper plate 30 (see FIGS. 3A and 3B) connected to the core assembly 28. The vertical hinge shaft 58 forms a third vertical axis 62, FIG. 6, which is displaced from the first vertical axis 34 and second vertical axis 42. The second gate pair 56, 68 serves as a framework for mounting the electronics circuit cards 46 thereto, in a manner similar to that shown in FIGS. 8 and 9 for the gate pair 36, 66.

The second gate pair 56, 68 may be deployed through the housing opening 22, as is shown in FIG. 6. By rotating the rotable core assembly 28 approximately 150° from its home position about axis 34 in direction 50, it will cause the gate pair extraction track 74 of FIG. 6 to line up with guide pin 52. This places the core assembly 28 in the left gate pair extraction position. In order to rotate the core 28 from its position in FIG. 6 to its position in FIG. 6A, the left gate pair is pulled, causing the core 28 to rotate about the first vertical axis 34 in a direction 50. The gate pair 56, 68 however, because of guide pin 52 engaging the extraction track 74, rotates about the third vertical axis 62 in a second direction 48. In this manner, the second gate pair 56, 68 extends through the housing opening 22 and reaches its fully deployed position, by pivoting the gate pair 56, 68 about the third vertical axis 62 in direction 48 to the position shown in FIG. 6B.

Figure 5B:
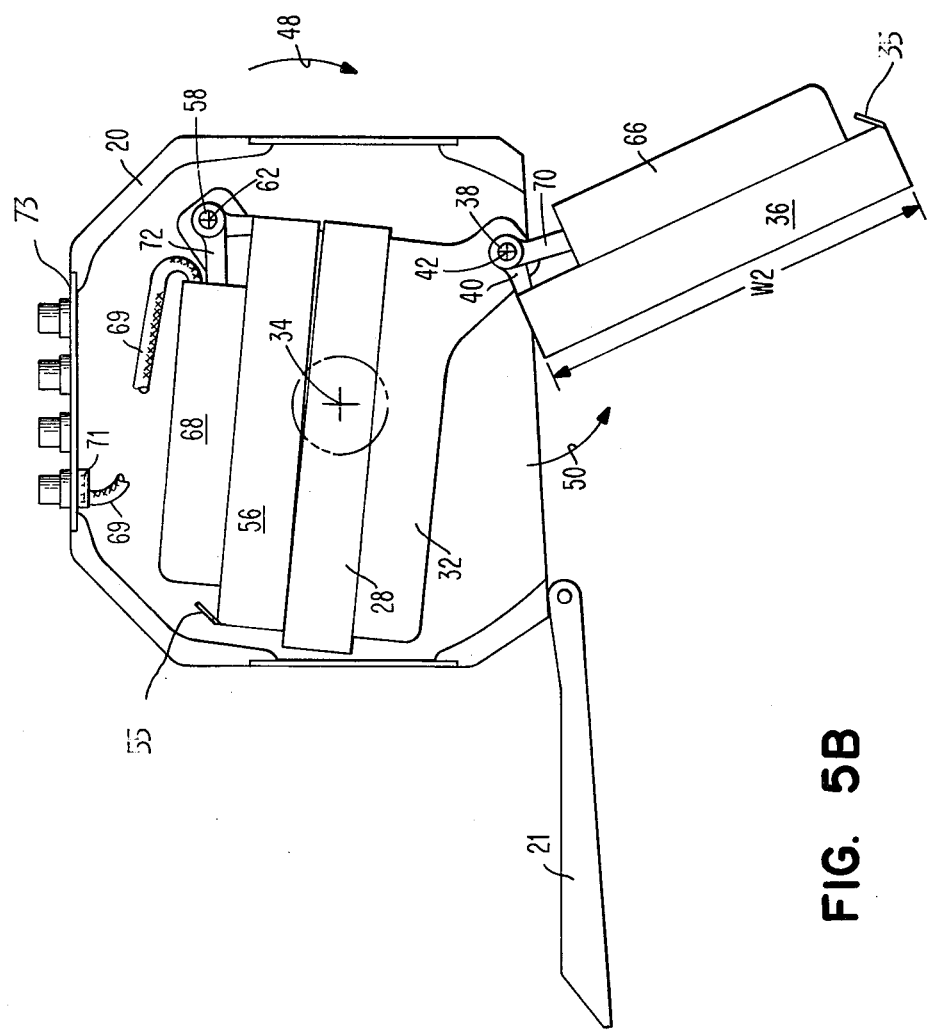
FIG. 5B is a plan view showing the right gate pair fully deployed and showing accessibility to the card side of the fixed center gate.

The gate 66 is hingedly mounted to the vertical hinge shaft 38 by means of the hasp 70, as is shown in FIGS. 5, 5A, and 5B, along the second vertical axis 42. In order to gain access to the pins which face each other in gates 36 and 66, the gate pair 36, 66 should be in its fully deployed position, as shown in FIG. 5B. The gate pair is separated by pivoting on the vertical hinge shaft 38. The side 84 of gate 36 and side 85 of gate 66, shown in FIG. 8, are the circuit card insertion sides. The opposite sides 45, which are the facing sides of gates 36 and 66, are the pin or probe sides.

Figure 6A:
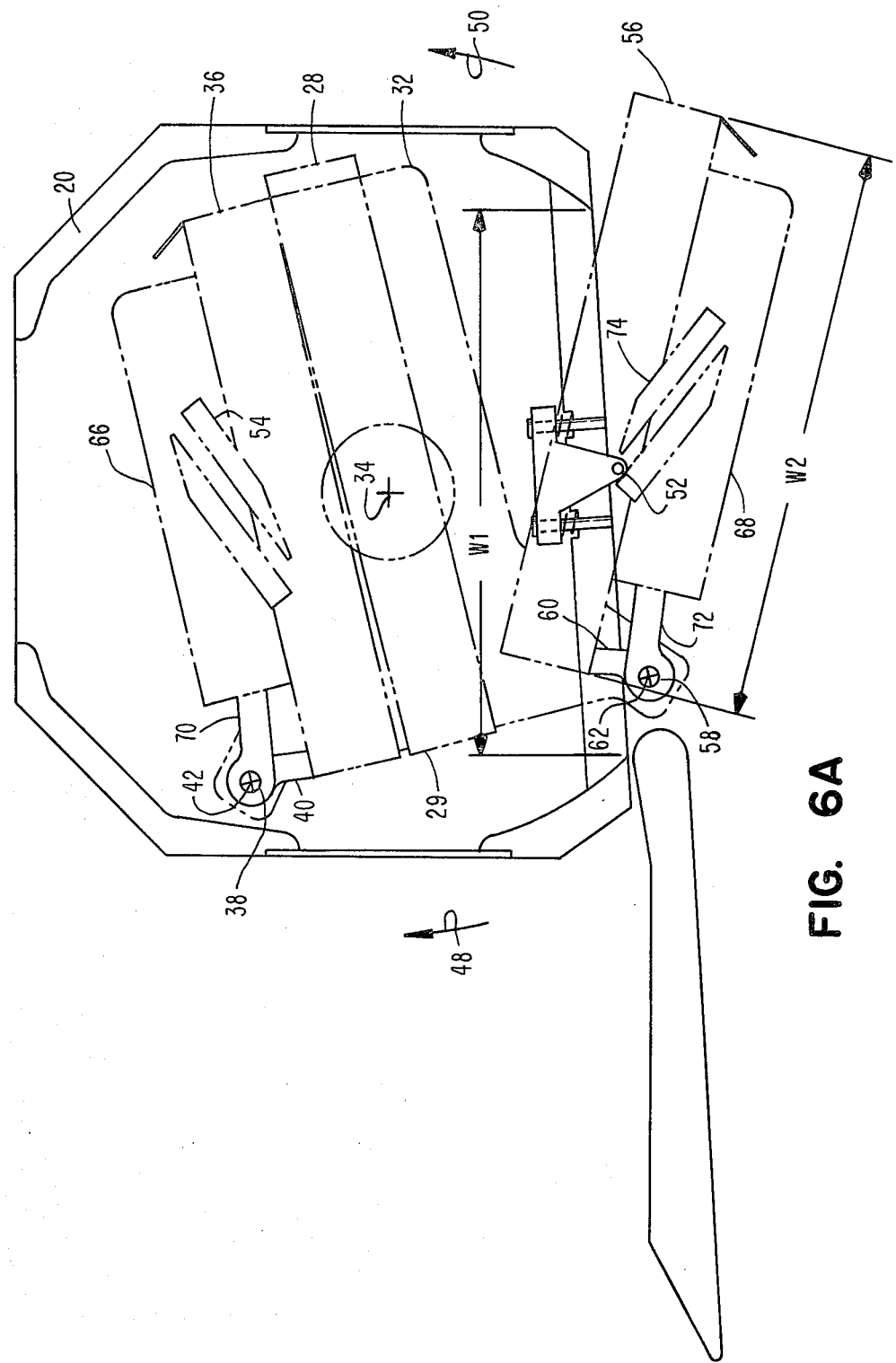
FIG. 6A is a plan view of the rotatable core assembly with the left gate pair having been pulled through the cabinet opening.
Figure 6B:
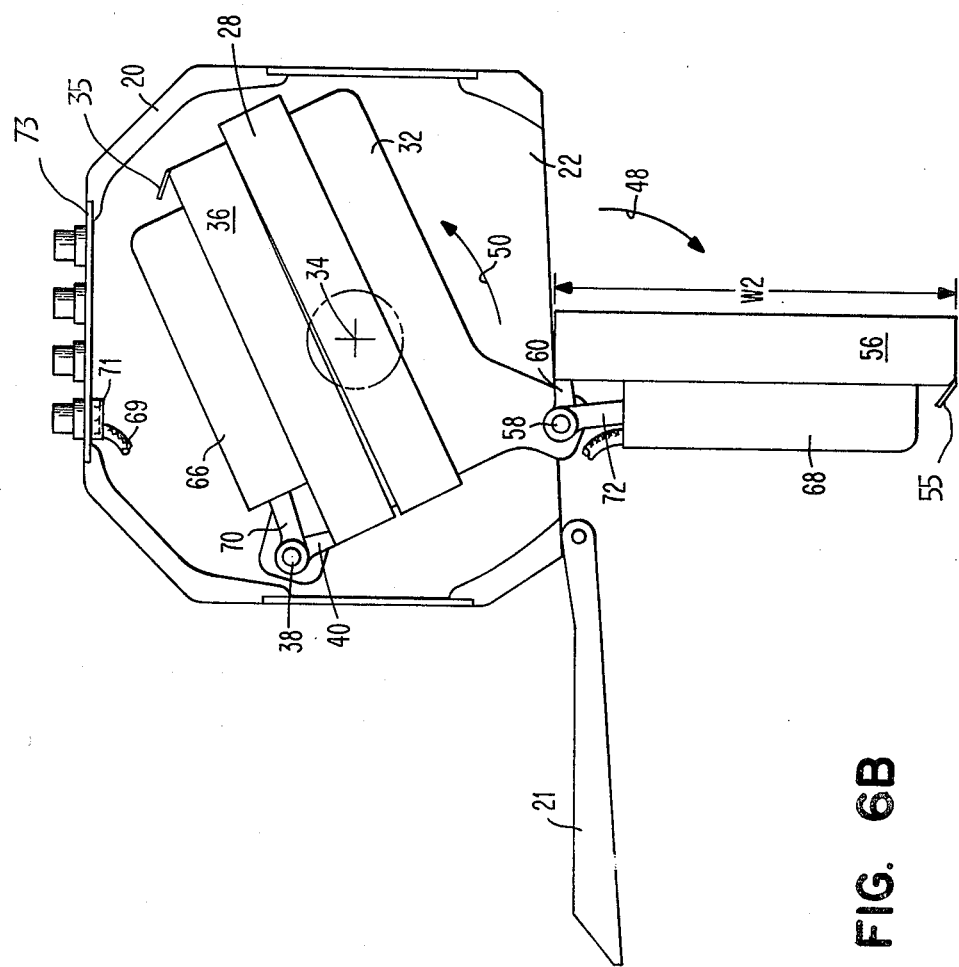
FIG. 6B is a plan view showing the left gate pair fully deployed and showing access to the pin side of the fixed center gate.

As shown in FIGS. 6, 6A, and 6B, the gate 68 is hingedly mounted by means of the hasp 72 to the vertical hinge shaft 58 along the third vertical axis 62. In a manner similar to that described for the gate 66, the gate 68 is deployed along with the gate 56, as is shown in FIG. 6B. The gate 68 is similar in structure and operation as gate 66. Access to the pin side of gate pair 56, 68 is similar to that of gate pair 36, 66.

FIG. 5B shows the cabling on the gate 68 connected to utilization devices outside the cabinet 20. An electrical connector 71 on the rear panel 73 of the cabinet 20 is electrically connected to the flexible cable 69. Cable 69, in turn, is mounted to gate 68 and the plurality of signal and power wires therein are distributed to the various circuit cards plugged into gate 68. Cables (not shown) are similarly connected to all of the gates.

The core assembly 28 also includes a center gate 29 (FIGS. 7 and 8) fixed to the top plate 30 and lower plate 32. Center gate 29 has its pin side adjacent to gate pair 56, 68, and its card side adjacent to gate pair 36, 66.

Reference is made to FIG. 4 which shows the front of the cabinet at an angle $\theta$. The purpose of the angular relationship is to permit the gate pair 36 and 66 to be fully extendable outside the cabinet so that access can be had to the center gate 29 for diagnostic and maintenance purposes. The door 21 is hollow-out to allow closure without interference with the rotatable core assembly.

A more detailed view of the gate construction and interrelationship with the circuit cards 46 may be seen in FIG. 9. The gate 36 is depicted as being constructed of a pair of vertical side manifolds 80 connected by horizontal guide rails 82, 84 and 86. Relatively large circuit boards 98 have connectors 96 mounted thereon. The guide rails 82, 84 and 86 have slots 94 therein which enable the sliding engagement of the edges 102 of the circuit card 46. The connector 100 mounted on the bottom of the circuit card 46 then plugs into the connector 96 on the circuit board 98. The circuit card 46 has the integrated circuit modules 104 mounted thereon. Wire wrap pins extend through the circuit board 98 so as to be exposed on the side opposite the connectors.

To dissipate heat from the integrated circuit modules 104 during their operation, the heat is conducted through the card structure 46 and through the slots 94 into the guide rails 82, 84 and 86. The guide rails have a hollow longitudinal channel 92 therethrough which is connected to hollow channels 90 in the vertical side manifolds 80 and the water supply hose 88 connected to the side manifolds 80, to circulate cooling water therethrough to more effectively carry away the heat generated on the cards 46. The guide rails 92 may be sealed by means of the seal 106 to the side manifolds 80. The supply hose 88 is flexible so as to enable the articulation of the gate 36 as discussed above. Flexible hoses are similarly attached to gates 56, 66 and 68.

Figure 7:
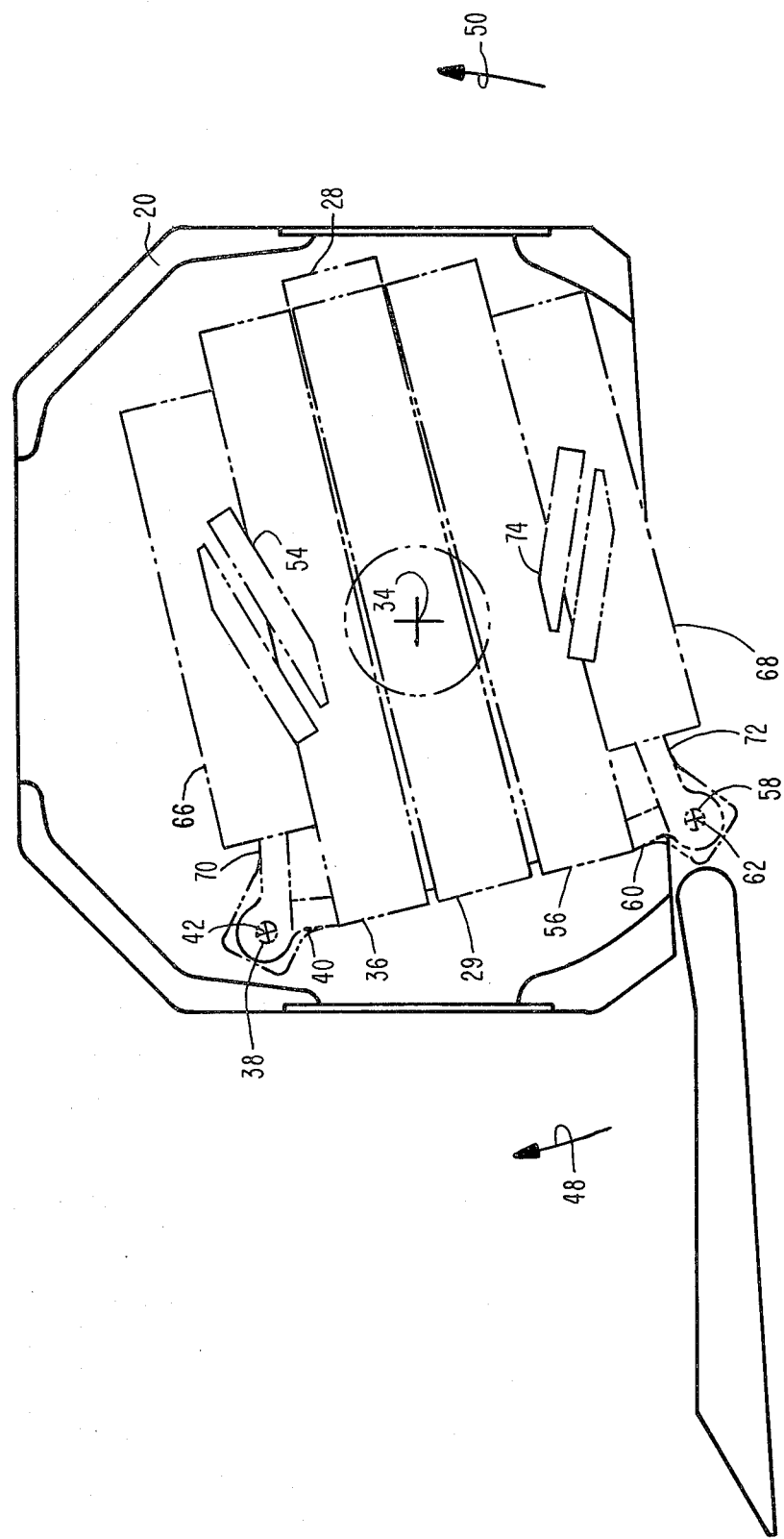
FIG. 7 is a plan view of the rotatable core assembly in its full travel position for card access.

It is intended to detent (or releasably lock) the central core assembly 28 in the home position, shown in FIG. 4; the right gate extraction position, shown in FIG. 5; the left gate extraction position, shown in FIG. 6; and the full travel position, shown in FIG. 7 which is beyond the left gate extraction position to provide access to the card side of gate 68 when the gate pair 56, 68 is not extracted. The detents have not been shown as it is well-known in the art how to provide a detent and forms no part of the invention.

OPERATION

In operation, initially the door is pivoted into its locked open position and the center core assembly is in its home position (see FIG. 4). The center core assembly is then rotated, by releasing it from its detent position, approximately 45° about axis 34 in a direction 50 whereupon it detents again in the right gate pair extraction position of FIG. 5. The right gate pair is then unlatched from the center core 28 and is pulled using handle 35 while simultaneously releasing the center core from its detent position which brings the right gate pair to its extracted position and the center core to its home detented position (see FIG. 5A). With the center core assembly detented in its home position, the right gate pair is pivoted into its locked center gate access position (see FIG. 5B).

In order to reinsert the right gate pair to the center core, the right gate pair is released from its locked access position and is pivoted until the extraction track 54 contacts the guide pin 52 (see FIG. 5A). At this point the center core is released from its detented home position while simultaneously pushing the gate pair back into the cabinet until the center core detents into its right gate extraction position, whereupon the gate pair is latched to the center core assembly (see FIG. 5).

In order to extract the left gate pair from the cabinet, the center core is released from its right gate pair extraction position, and is rotated approximately 100° about axis 34 in direction 50 until it detents into its left gate extraction position (see FIGS. 6A and 6B). From this point, the left gate extraction motion is similar to that described above for the right gate extraction motion by unlatching and then pulling the handle 55.

When it is desired to go to the full travel position for card side access to gate 68, the center core is released from its left gate extraction position and rotated about access 34 in direction 50 approximately 50° to detent in the full travel position (see FIG. 7).

It is to be noted that although the width W2 of the gates is wider than the opening 22, the width of the core assembly has a length L1, as shown in FIG. 3A, which is narrower than the opening 22. This provides the advantage of the core assembly being removable from the cabinet by the upper platform 26 also being removable. After the upper platform 26 is removed, the core assembly can be lifted approximately six inches and pulled through the cabinet opening 22. This provides long access to each gate, both card and pin side simultaneously, for debug and unit testing.

In connection with the removability of the rotatable core assembly from the cabinet, the rear panel 73 is unfastened from the cabinet and turned so that it can pass through the cabinet and opening 22 simultaneously with the rotatable core assembly, while all cables are still attached.

While the invention has been particularly shown and described with reference to the preferred embodiment thereof, it will be understood by those skilled in the art that the foregoing and other changes in form and details may be made therein without departing from the spirit and scope of the invention.

Having thus described my invention, what we claim as new, and desire to secure by Letters Patent is:

1. A high density electronic cabinet, comprising:
   a housing having an opening with a first horizontal width, a bottom horizontal platform and a top horizontal platform;
   a central core assembly rotatably mounted in said housing on a central bearing on said lower and upper platforms for rotational motion about a first vertical axis;
   a first gate pair on said central core assembly for mounting electronic circuit cards thereto having a second horizontal width greater than said first width, hingedly mounted along a second vertical axis displaced from said first vertical axis, each gate of said first gate pair having a pin side and a card side;
   said first gate pair being deployed through said housing opening by rotating said core about said first vertical axis in a first direction 48 and rotating said gate pair about said second axis in a second direction 50 opposite to said first direction, extending the first gate pair through said housing opening;
   the two gates of said first gate pair movable as a single unit and each gate being separable from the other gate of the pair to expose the pin sides of each gate of the pair for diagnostic inspection.

2. The apparatus of claim 1, which further comprises:
   a second gate pair on said central core assembly having a second horizontal width greater than said first width, hingedly mounted along a third vertical axis displaced from said first and said second vertical axes opposite said first gate pair for mounting electronic circuit cards thereto, each gate of said second gate pair having a pin side and a card side;
   said second gate pair being deployed through said housing opening by rotating the core about said first vertical axis in said second direction 50 and rotating said second gate pair about said third axis in said first direction 48 opposite to said second direction, extending said second gate pair through said housing opening;
   the two gates of said second gate pair movable as a single unit and each gate of said second gate pair being separable from the other gate of the second gate pair to expose the pin sides of each gate of the second gate pair for diagnostic inspection.

3. The apparatus of claim 2, which further comprises a central gate fixed to said core whereby the card side of said central gate is accessible through the cabinet opening when the first gate pair is extended outside the cabinet, and the pin side of said central gate is accessible through the cabinet opening when the second gate pair is extended outside the cabinet.

4. The apparatus of claim 3, wherein the front of the cabinet is at an angle to the back of the cabinet so that the first gate pair can be fully extendable through the opening to enable access to the central gate assembly.

* * * * *